United States Patent
Chalasani et al.

(10) Patent No.: US 9,467,149 B2
(45) Date of Patent: Oct. 11, 2016

(54) METHODS AND SYSTEMS FOR DISTRIBUTING CLOCK AND RESET SIGNALS ACROSS AN ADDRESS MACRO

(71) Applicant: Kool Chip, Inc., San Jose, CA (US)

(72) Inventors: Prasad Chalasani, San Jose, CA (US); Venkata N.S.N. Rao, Fremont, CA (US)

(73) Assignee: SOCTRONICS, INC., Santa Clara, CA (US)

( * ) Notice: Subject to any disclaimer, the term of this patent is extended or adjusted under 35 U.S.C. 154(b) by 277 days.

(21) Appl. No.: 14/170,064

(22) Filed: Jan. 31, 2014

(65) Prior Publication Data

US 2014/0317434 A1    Oct. 23, 2014

Related U.S. Application Data

(60) Provisional application No. 61/814,153, filed on Apr. 19, 2013.

(51) Int. Cl.

| | |
|---|---|
| *G06F 17/50* | (2006.01) |
| *H03L 7/00* | (2006.01) |
| *H03K 19/0175* | (2006.01) |
| *G06F 13/38* | (2006.01) |
| *H03L 7/08* | (2006.01) |
| *H03L 7/093* | (2006.01) |
| *H04L 7/00* | (2006.01) |
| *G06F 1/28* | (2006.01) |
| *G06F 1/04* | (2006.01) |
| *G06F 1/10* | (2006.01) |
| *H04L 25/02* | (2006.01) |

(52) U.S. Cl.
CPC .. *H03L 7/00* (2013.01); *G06F 1/04* (2013.01); *G06F 1/10* (2013.01); *G06F 1/28* (2013.01); *G06F 13/385* (2013.01); *H03K 19/0175* (2013.01); *H03K 19/017509* (2013.01); *H03L 7/0802* (2013.01); *H03L 7/093* (2013.01); *H04L 7/0012* (2013.01); *H04L 25/028* (2013.01); *H04L 25/0276* (2013.01)

(58) Field of Classification Search
CPC ............ G11C 15/00; G11C 7/22; G06F 1/10; G06F 1/00; G06F 2101/00; H03K 19/20
USPC ......... 327/295, 291, 153, 115, 199, 219, 270; 326/101, 93; 716/114, 106, 111; 713/500, 401; 365/203; 361/115
See application file for complete search history.

(56) References Cited

U.S. PATENT DOCUMENTS

| | | | | |
|---|---|---|---|---|
| 5,570,045 A | * | 10/1996 | Erdal ................. | G06F 17/5077 326/101 |
| 6,434,704 B1 | * | 8/2002 | Dean ..................... | G06F 1/10 713/320 |
| 6,718,477 B1 | * | 4/2004 | Plants .................... | G06F 1/10 713/500 |
| 8,471,607 B1 | * | 6/2013 | Pace ..................... | H03K 23/54 327/115 |
| 2003/0212971 A1 | * | 11/2003 | Rodgers ............. | G06F 17/5077 327/295 |

(Continued)

*Primary Examiner* — Aurel Prifti
(74) *Attorney, Agent, or Firm* — Venture Pacific Law, PC

(57) ABSTRACT

A distribution network for distributing clock and reset signals across an address macro has circuit blocks having dividers and counters, drivers connected in a balanced tree, and drivers connected in an unbalanced tree. The dividers and counters are synchronized relative to a clock signal. The drivers connected in the balanced tree distribute the clock signal synchronously to the circuit blocks. The drivers connected in the unbalanced tree distribute a reset signal to the circuit blocks. The clock signal is distributed via the balanced tree as a function of the reset signal.

14 Claims, 13 Drawing Sheets

(56) References Cited

U.S. PATENT DOCUMENTS

| | | | |
|---|---|---|---|
| 2005/0134353 A1* | 6/2005 | Tahara | G06F 1/10 327/295 |
| 2006/0120189 A1* | 6/2006 | Beerel | G06F 17/5059 365/203 |
| 2006/0291126 A1* | 12/2006 | Wilcox | G06F 17/5022 361/115 |
| 2007/0033560 A1* | 2/2007 | Johnston | G06F 17/505 716/114 |
| 2007/0182475 A1* | 8/2007 | Shimazaki | G06F 1/10 327/295 |
| 2008/0201597 A1* | 8/2008 | Chong | G11C 7/1066 713/401 |
| 2009/0019407 A1* | 1/2009 | Matsui | G06F 1/10 716/106 |
| 2009/0187873 A1* | 7/2009 | Nikitin | G06F 17/505 716/129 |
| 2009/0189641 A1* | 7/2009 | Toyonoh | G06F 17/5068 326/93 |
| 2009/0195274 A1* | 8/2009 | Ohyabu | G06F 1/10 327/153 |
| 2010/0229139 A1* | 9/2010 | Kitaoka | G06F 17/5081 716/111 |
| 2011/0115524 A1* | 5/2011 | Rowhani | H03K 3/012 326/93 |
| 2012/0274377 A1* | 11/2012 | Alben | H03K 3/012 327/199 |
| 2012/0275238 A1* | 11/2012 | Mazumder | G11C 7/02 365/189.05 |
| 2014/0077856 A1* | 3/2014 | Sofer | G06F 1/206 327/219 |
| 2014/0167831 A1* | 6/2014 | Wu | H03K 3/59 327/291 |
| 2015/0098540 A1* | 4/2015 | Priel | G06F 1/10 375/356 |
| 2015/0323959 A1* | 11/2015 | Arabi | G06F 1/10 327/270 |

* cited by examiner

METHODS AND SYSTEMS FOR DISTRIBUTING CLOCK AND RESET SIGNALS ACROSS AN ADDRESS MACRO

CROSS REFERENCE

This application claims priority from a provisional patent application entitled "Apparatuses, Methods, and Systems Using Integrated Circuits" filed on Apr. 19, 2013 and having an Application No. 61/814,153. Said application is incorporated herein by reference.

FIELD OF INVENTION

This invention generally relates to methods and systems for distributing signals in a computing device and, in particular, to methods and systems for distributing clock and reset signals in a computing device.

BACKGROUND

A physical layer of a computing device ("PHY") is used for communicating between integrated circuits and external devices, such as other integrated circuits, typically through a data bus or a set of signal wires. The physical layer is typically configured to implement a desired communication protocol or specification that has been established for the particular application.

FIG. 1a illustrates a diagram of a physical layer of the prior art for communicating between a memory controller and an external memory device. A standard double data rate ("DDR") PHY 12 interacts with an on-chip memory controller 10 and an off-chip dynamic random-access memory ("DRAM") 22. The PHY 12 comprises a DDR physical layer interface ("DFI") 14, first-in-first-out ("FIFO") buffers 16, and address and data macros 18 for transmitting data between the FIFO buffers 16 and the DRAM 22. The memory controller 10 and the PHY 12 represent two primary design elements in DDR memory systems, which are used in virtually all electronic system designs, from cellphones and set-top boxes, to computers and network routers.

The DFI specification defines an interface protocol between the memory controller 10 and the PHY 12, with a goal of reducing integration costs while enabling performance and data throughput efficiency. The DFI protocol defines the signals, timing, and functionality required for efficient communication across the PHY, which is known by a person having ordinary skill in the art. The DFI specification also allows the memory controller 10 to be operated at a same frequency as DRAM 12, or at half (or other fraction) of the frequency of the DRAM 12.

FIG. 1b illustrates a graph of clock signals for a physical layer interface of the prior art. A CLK_CTL clock signal is inputted to the memory controller 10 from the clock generator 20 for clocking the memory controller 10. A CLK_MEM clock signal is inputted to the address and data macros 18 of the PHY 12 for clocking the address and data macros 18 to receive data from and/or transmit data to the DRAM 22. The CLK_CTL clock signal and the CLK_MEM clock signal are plotted side-by-side along a time axis. The CLK_MEM clock signal can have twice (or another multiple of) the frequency of the CLK_CTL clock signal. Also, the CLK_MEM clock signal and the CLK_CTL clock signal are asynchronous signals. Thus, there is uncertainty as to alignment of the clock signals. Since the frequencies of the CLK_CTL signal and CLK_MEM are different, the FIFO buffers 16 are needed to buffer any data to account for this asynchronous.

The depths of logic in the PHY 12 and in the memory controller 10 are different, and, moreover, the logic may be operating at integral multiple frequencies, which prove to be challenging during integration. The width of the PHY 12 makes it even more difficult to align the clock signals, e.g., the CLK_CTL, CLK_MEM, and the CLK_DFI signal, for the respective logic and components.

Traditionally, the FIFO buffers 16 are employed to store data between the memory controller 10 and the DRAM 22 in the PHY 12. The memory controller 10 writes data according to the CLK_CTL signal edge. The PHY 12 can then read/write the data according to the timing of the CLK_MEM signal. Based on the type of command, the PHY 12 can read data from the DRAM 22 or write data to the DRAM 22. A clock generator 20 generates the clock signals CLK_CTL, CLK_MEM, and CLK_DFI according to the operating frequencies of the memory controller 10, the DRAM 12, and according to the DFI specification.

If a write command is given, the PHY 12 reads the data based upon the CLK_MEM signal, and routes the appropriate command and data. If a read memory command is given, the PHY 12 reads the data based on the CLK_MEM signal and sends the appropriate command and data. The PHY 12 also can read the data, sending an appropriate command, and wait for the data from the DRAM 22. Once the data is available, the PHY 12 writes the data to the FIFO buffers 16, and informs the availability of data to the memory controller 10.

There must be a significant number of FIFO buffers 16 in the PHY 12 to provide reliable operation due to the frequency ratio of the CLK_CTL and the CLK_MEM signals, and due to uncertainties between and among clock distributions for the various components of the PHY 12. Additionally, the minimum latency for reliable operation needs at least three additional cycles of CLK_MEM due to a clock domain crossing, which will increase the overall latency of the system and also increase the needed chip area. The depth of the FIFO buffers 16 also depends on the frequency ratio and the skew between the clock signals from the clock generator 20.

Therefore, there exists a need to provide new methods and systems for providing a PHY that can account for any frequency ratio, decrease latency, and reduce the amount of chip area used for the PHY. In particular, there exists a need to provide new methods and systems for a PHY that do not need FIFO buffers between a memory controller and an external memory.

Additionally, the PHY must evenly distribute a reset signal and the clock signals throughout the PHY and the memory controller. In order to keep the data in correct order, the reset signal must be simultaneously distributed throughout the memory controller and the PHY.

FIG. 7 illustrates a diagram of a distribution network of the prior art for distributing clock and reset signals. Typically, a DDR data macro can be 72 bits wide in depth, and 10 mm long in length. Due to its relatively extensive depth and length, clock distribution in the DDR macro is challenging in itself, and further difficult when trying to synchronize the signals for the DDR macro. Prior art uses two independent balanced distribution networks, one for a clock signal I_CLK and the other for a reset signal I_RESET, where both balanced distribution networks comprise a network of drivers, e.g., buffers, clock drivers, etc., for synchronously driving a clock signal.

For instance, the clock signal I_CLK is distributed to divider and counter blocks 30 via a first distribution network 28. Simultaneously, a clock signal I_RESET is also distributed to divider and counter blocks 30 via a second distribution network 26 to mirror the timing of when the I_RESET signal is received by each of the divider and counter blocks 30.

Unfortunately, the second distribution network 26 consumes a great amount of chip area and consumes a great amount of power.

Therefore, there exists a need to provide new methods and systems for distributing clock and reset signals to reduce the amount of chip area used and to reduce power consumption for distributing the clock and reset signals.

SUMMARY OF INVENTION

An object of this invention is to provide methods and systems for distributing clock and reset signals of a computing device that reduce chip area usage and power consumption.

Another object of this invention is to provide methods and systems for distributing clock and reset signals using an unbalanced distribution network.

Yet another object of this invention is to provide methods and systems for distributing clock and reset signals of a computing device for synchronous operation of divider and counter blocks of the computing device.

Briefly, the present invention discloses a distribution network, comprising: circuit blocks having counters, wherein the counters are synchronized relative to an input signal; drivers connected in a balanced tree for distributing the input signal synchronously to the circuit blocks; and drivers connected in an unbalanced tree for distributing a reset signal to the circuit blocks, wherein the input signal is distributed via the balanced tree as a function of the reset signal.

An advantage of this invention is that methods and systems for distributing clock and reset signals of a computing device are provided that reduce chip area usage and power consumption.

Another advantage of this invention is that methods and systems for distributing clock and reset signals are provided using an unbalanced distribution network.

Yet another advantage of this invention is that methods and systems for distributing clock and reset signals of a computing device for synchronous operation of divider and counter blocks of the computing device.

DESCRIPTION OF THE DRAWINGS

The foregoing and other objects, aspects, and advantages of the invention can be better understood from the following detailed description of the preferred embodiment of the invention when taken in conjunction with the accompanying drawings in which.

DETAILED DESCRIPTION OF THE PREFERRED EMBODIMENTS

In the following detailed description of the embodiments, reference is made to the accompanying drawings, which form a part hereof, and in which is shown by way of illustration of specific embodiments in which the present invention may be practiced.

Generally, the present invention provides methods and systems for synchronizing various clock signals used in a PHY and a memory controller of a computing device. Synchronization can include phase alignment along the respective rising edges (or the respective falling edges) of a plurality of signals to be synchronized. Thereby, the need for clock domain crossing synchronization can be eliminated.

Figure 1A:
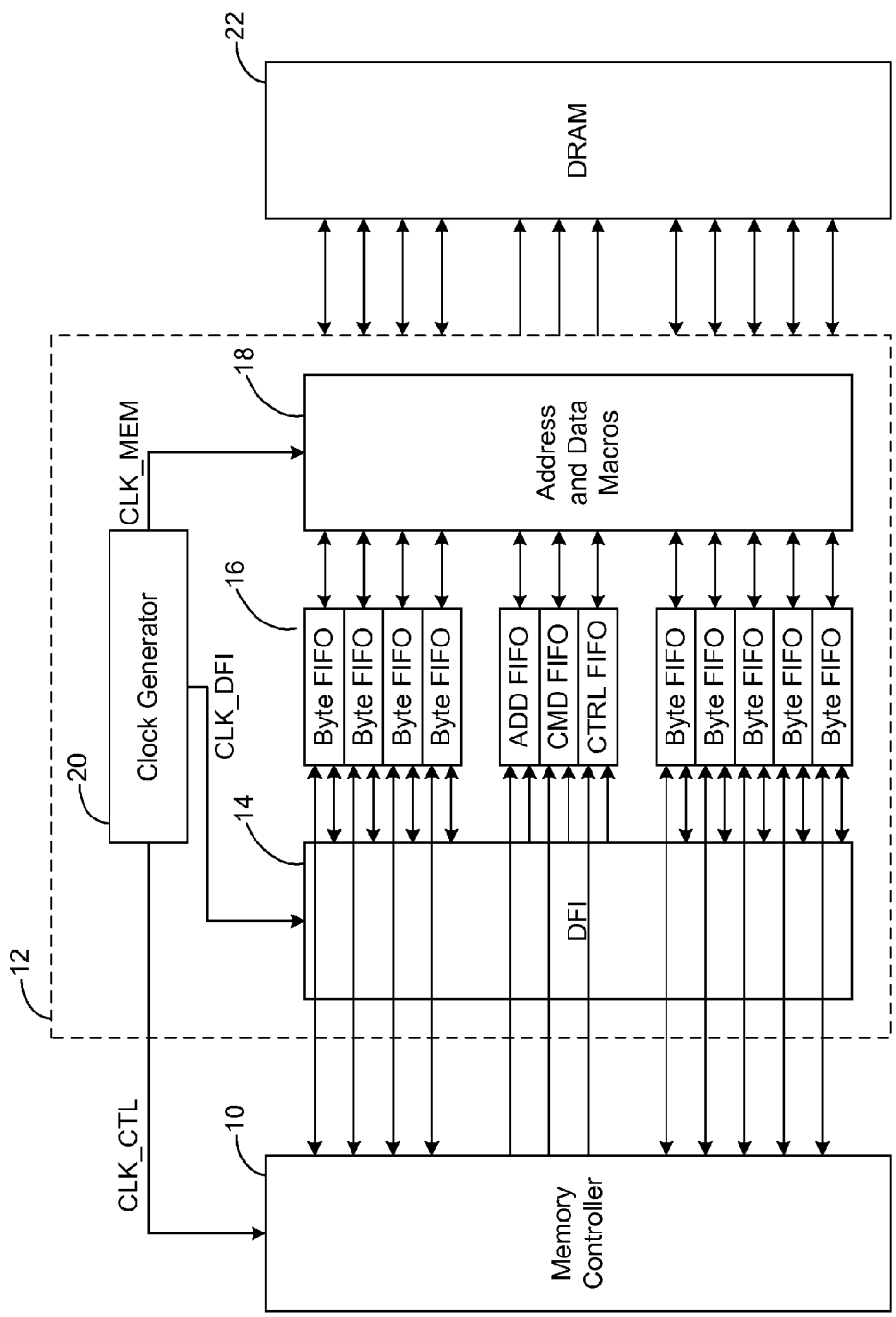
FIG. 1a illustrates a diagram of a physical layer interface of the prior art between a memory controller and external memory device.
Figure 1B:
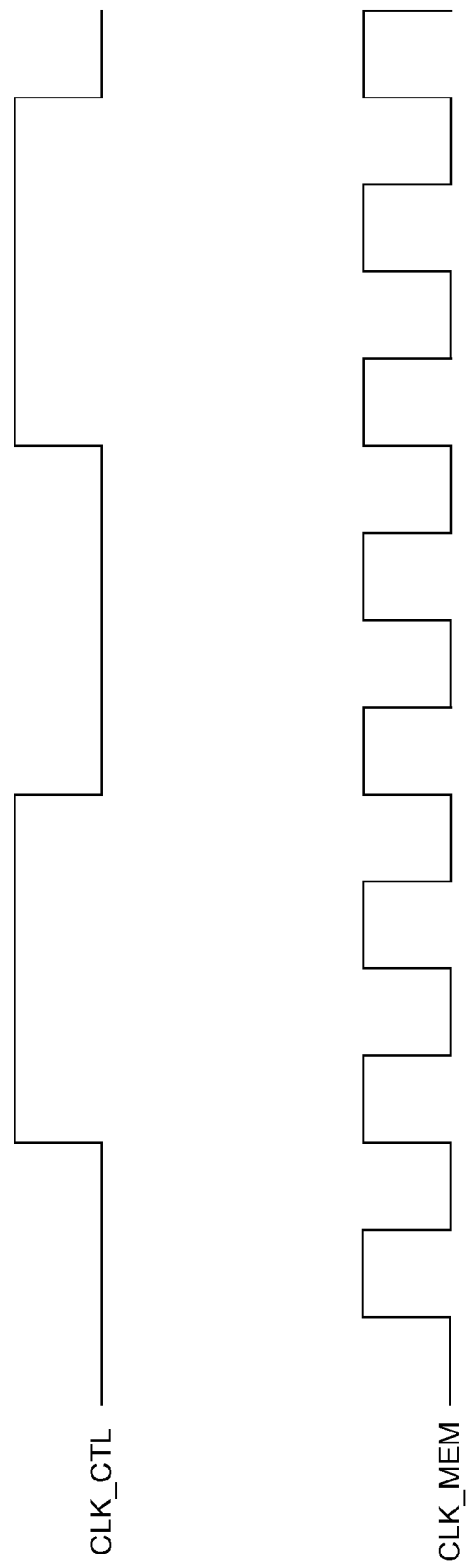
FIG. 1b illustrates a graph of clock signals for a physical layer interface of the prior art.
Figure 2A:
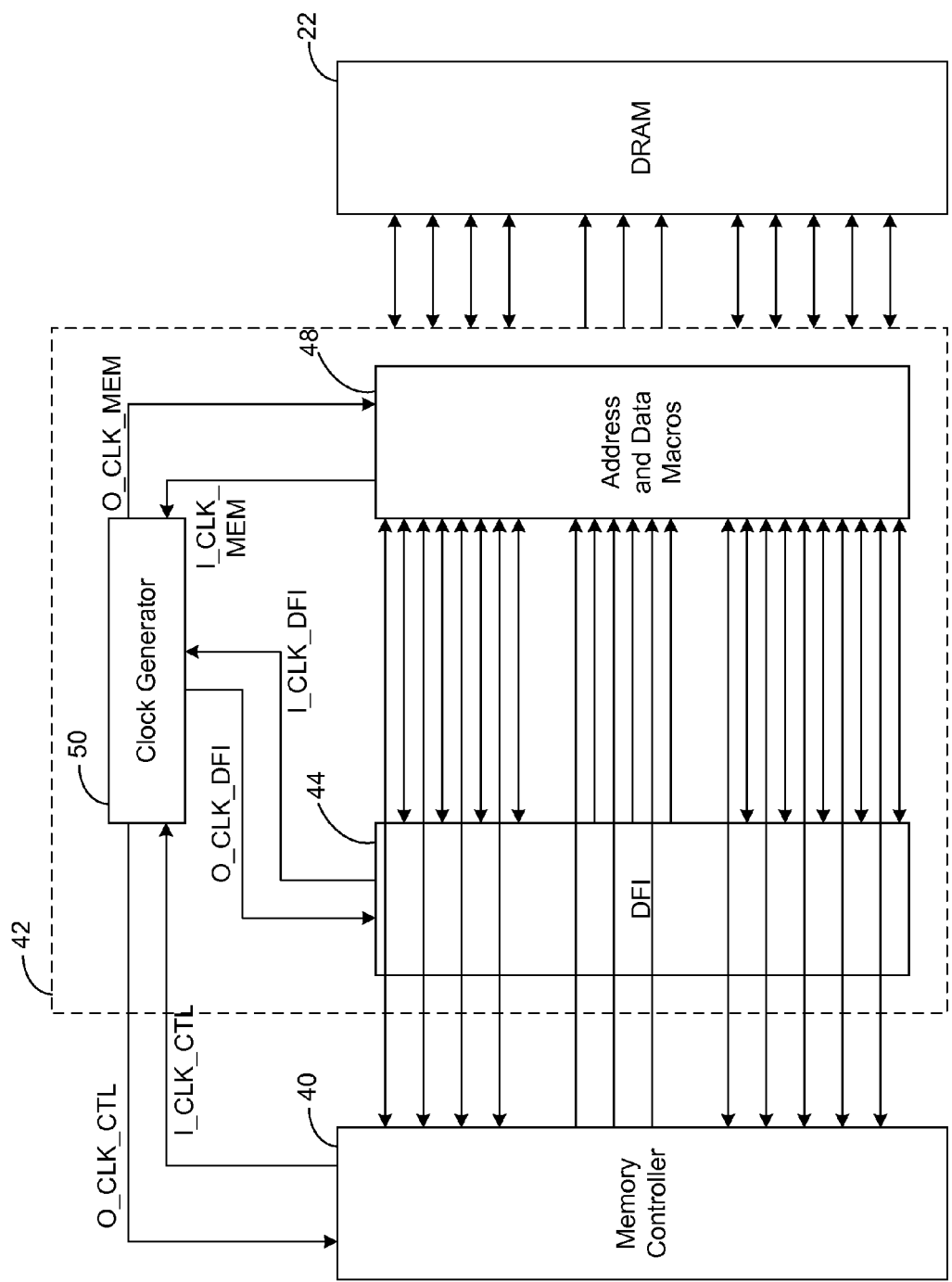
FIG. 2a illustrates a diagram of the present invention of a physical layer interface between a memory controller and memory.

FIG. 2a illustrates a diagram of the present invention for interfacing a memory controller and an external memory via a PHY. A PHY 42 comprises a clock generator 50, a DFI block 44, and address and data macros 48 for communicating between the PHY 42 and a DRAM 22. The clock generator 50 generates clock signals for clocking a memory controller 40, the DFI block 44, and the address and data macros 48. For instance, the clock generator 50 generates an output signal O_CLK_CTL to the memory controller 40 and receives an input signal I_CLK_CTL from the memory controller 40. The output signal O_CLK_CTL is distributed throughout the memory controller 40 and can be routed back to the clock generator 50 as the input signal I_CLK_CTL. Thus, the clock generator 50 can adjust and synchronize the output signal O_CLK_CTL as a function of the input signal I_CLK_CTL, which can serve as a feedback signal.

Also, the clock generator 50 generates an output signal O_CLK_DFI to the DFI block 44 and receives an input signal I_CLK_DFI from the DFI block 44. The output signal O_CLK_DFI is distributed throughout the DFI block 44 and can be routed back to the clock generator 50 as the input signal I_CLK_DFI. Thus, the clock generator 50 can adjust and synchronize the output signal O_CLK_DFI as a function of the input signal I_CLK_DFI, which can serve as a feedback signal.

Furthermore, the clock generator 50 generates an output signal O_CLK_MEM to the address and data macros 48 and receives an input signal I_CLK_MEM from the address and data macros 48. The output signal O_CLK_MEM is distributed throughout the address and data macros 48 and can be routed back to the clock generator 50 as the input signal I_CLK_MEM. Thus, the clock generator 50 can adjust and synchronize the output signal O_CLK_MEM as a function of the input signal I_CLK_MEM, which can serve as a feedback signal. The I_CLK_DFI signal and the I_CLK_MEM signal can be at the same frequency. This frequency can be an integer divisor of the reference clock.

Figure 2B:
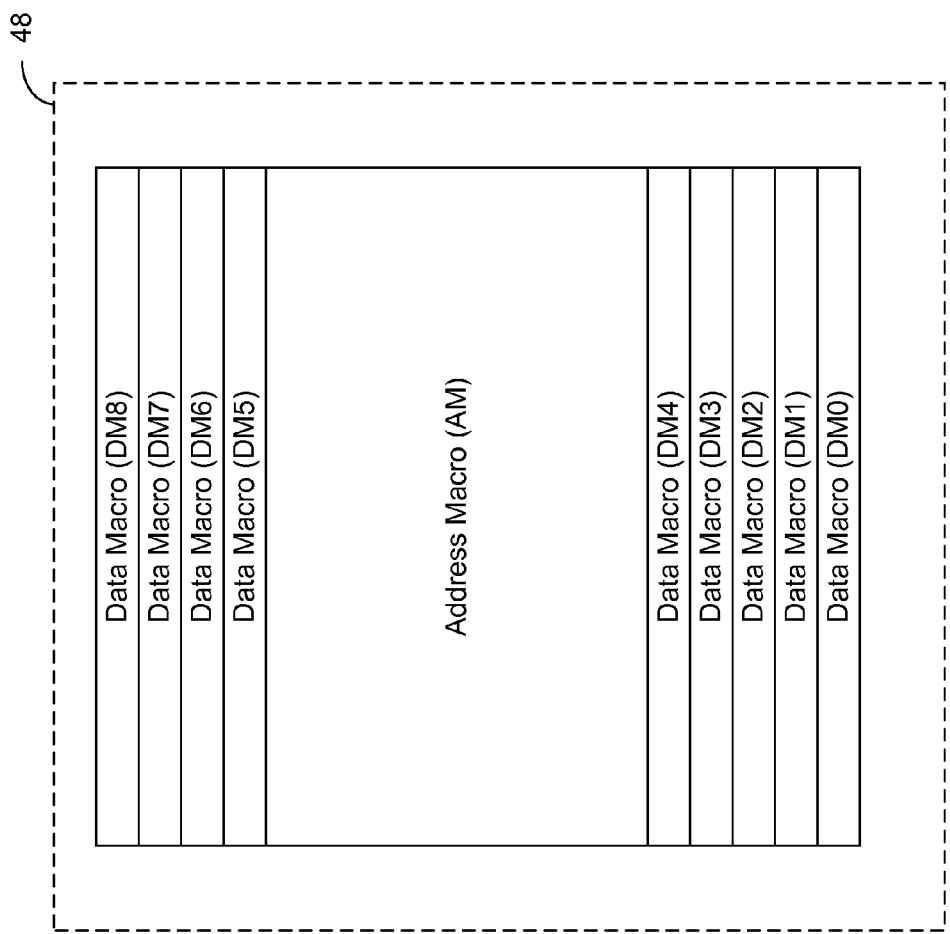
FIG. 2b illustrates a block diagram for address and data macros.

FIG. 2b illustrates a block diagram for address and data macros. The address and data macros 48 can comprise an address macro and data macros DM0-DM8. The address and data macros 48 provide analog circuitry for the PHY 42, including DLLs, drivers, etc. The address and data macros 48 can be clocked by the clock generator 50.

Figure 3A:
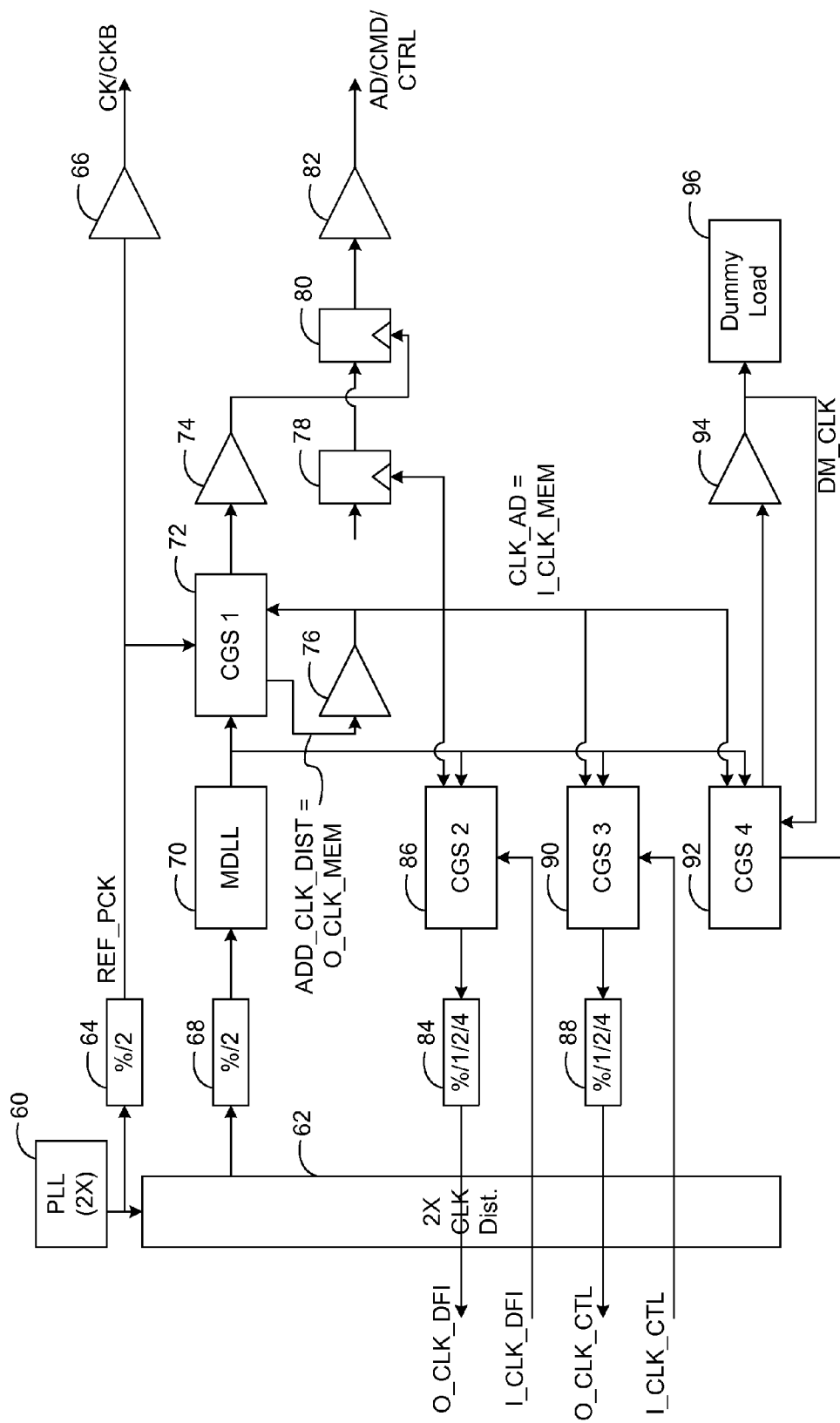
FIGS. 3a-3b illustrate a diagram of the present invention for synchronizing clock signals of a physical layer interface.
Figure 3B:
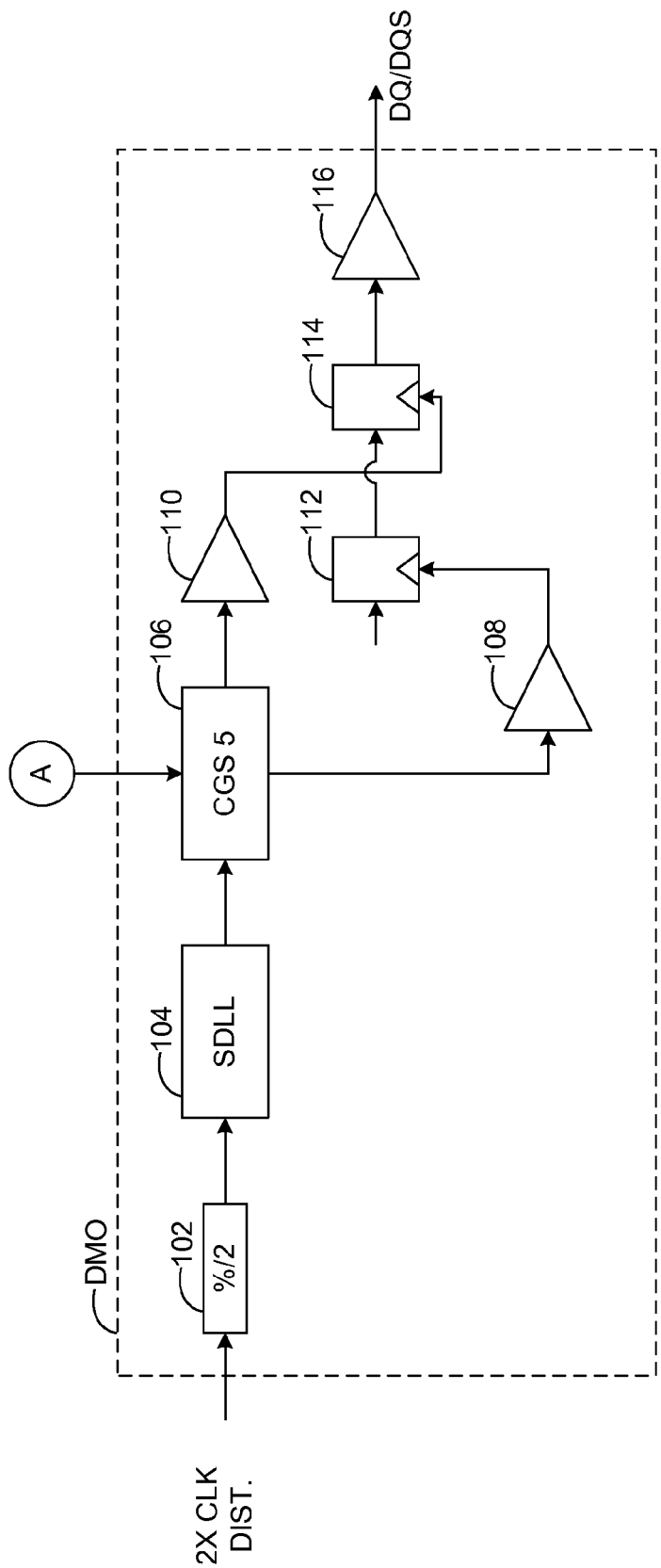

FIGS. 3a-3b illustrate a diagram of the present invention for synchronizing clock signals for a PHY and a memory controller of a computing device. A phase locked loop ("PLL") 60 generates a clock signal that has twice the frequency (a "2×-clock") of a system clock signal of the computing device. The 2×-clock is distributed 62 with minimum skew between end points. The frequency of the 2×-clock of the PLL 60 is halved by a divider block 64 to generate a REF_PCK signal, which can be distributed to the memory device of the computing system (e.g., DRAM) via a driver 66. The REF_PCK signal can also be a primary reference clock signal for synchronization of the other clock signals of the PHY and the memory controller of the computing device.

The 2×-clock can also be inputted to a divider block 68 to reduce its frequency by one half to generate a 1×-clock. The 1×-clock is then inputted to a MDLL 70. The MDLL 70 outputs various phase signals of the 1×-clock, which are fed to a clock generation and synchronization block 72 ("CGS 1"), a clock generation and synchronization block 86 ("CGS 2"), a clock generation and synchronization block 90 ("CGS 3"), and a clock generation and synchronization block 92 ("CGS 4").

The output clock signal from the CGS 1 is distributed across the address macro via a distribution network 74. The CGS 1 also outputs the address clock distribution signal (also referred to as "0 CLK_MEM signal") via a distribution network 76. A CLK_AD (also referred to as "I_CLK_MEM") signal at the end point of the distribution network 76 is fed back to the CGS 1. The CGS 1 can then compare the CLK_AD signal with the REF_PCK signal. The CGS 1 adjusts the output clock signals until the CLK_AD signal is aligned to the REF_PCK signal. The aligned CLK_AD signal also acts as a reference clock to the rest of the CGS 2-4 to generate the PHY clock signals O_CLK_DFI and O_CLK_CTL.

Specifically, for the O_CLK_CTL signal, the generated output from the CGS 3 is inputted to a divider block 88 that can divide the frequency of the output signal from the CGS 3 by an integer value, e.g., by 1, by 2, by 4, or some other integer value. The controller clock signal O_CLK_CTL is fed to the memory controller, and further distributed across the memory controller. The end point of memory controller clock distribution, i.e., I_CLK_CTL signal, can be fed back to the CGS 3 in a feedback loop. The I_CLK_CTL signal is compared with the CLK_AD signal. The CGS 3 adjusts the phase of the output clock O_CLK_CTL until the incoming I_CLK_CTL is synchronized with the signal CLK_AD.

Similarly, for the O_CLK_DFI signal, the generated output from the CGS 2 is inputted to a divider block 84 that can divide the frequency of the generated output from the CGS 2 by an integer value, e.g., by 1, by 2, by 4, or some other integer value. The clock signal O_CLK_DFI is fed to the DFI block of the PHY, further distributed across the DFI block. The end point of the DFI block distribution can be fed back as the I_CLK_DFI signal. The I_CLK_DFI signal is compared with the CLK_AD signal. The CGS 2 adjusts the phase of the output signal O_CLK_DFI until the incoming I_CLK_DFI signal is synchronized to the CLK_AD signal.

The CLK_AD signal also clocks a flop 78, and the output of the distribution network 74 clocks a flop 80. Data, from the memory controller of the computing device can flow serially starting at the flop 78, to the flop 80, and to a driver 82. The driver 82 outputs the data for address, command, and control data to the memory device, e.g., DRAM.

Since the data and addresses come from the memory controller or DFI block, the data clock should be aligned to the address clock. The CGS 4 provides synchronization of a dummy clock to the address clock. The output clock generated by the CGS 4 is fed to a data macro dummy load 96 via a distribution network 94. The end of the data macro dummy load, a DM_CLK signal, is compared with the CLK_AD signal. The DM_CLK signal is adjusted until the DM_CLK signal is in sync with the CLK_AD signal. A configuration code O_PH_CTRL is preserved, and fed to the all the data macros, e.g., DM0-8.

FIG. 3b illustrates a data macro DM0. The other data macros are similar to DM0 and are not shown, but would be apparent to a person having ordinary skill in the art. The active data macros DM0-8 receive a balanced 2×-clock, and send it through the respective slave DLL ("SDLL") and CGS blocks with the configuration code preserved from the CGS 4. The CGS 4 can be connected to the CGS's of the other data macros DM0-8 for providing the configuration code.

For instance in DM0, the 2×-clock is distributed to a divider block 102. The divider block 102 divides the frequency of the 2×-clock by 2 to generate a 1×-clock. The 1×-clock is outputted to the SDLL 104. The SDLL 104 outputs a signal to the CGS 5. The CGS 5 generates a signal based on the input from the SDLL 104 and the configuration code from CGS 4. The generated signal of the CGS 5 is outputted to distribution networks 110 and 108 for clocking flops 112 and 114. Data, e.g., from the memory controller, can flow serially starting at the flop 112, to the flop 114, and to the driver 116. The driver 116 outputs the signal DQ/DQS to the memory device, e.g., DRAM. Similarly, for the other DM1-8, the 2×-clock is distributed along with the configuration code in a similar manner for those data macros.

It is understood by a person having ordinary skill in the art that the data direction can be outgoing to the memory device as shown in FIG. 3b, as well as incoming from the memory device, which is not shown. Diagrams for receiving data from the memory device to the data macros DM0-8 are not shown, but are readily apparent based on the present disclosure to a person having ordinary skill in the art.

Generally, a clock synchronization flow of the present invention can be as follows: (1) align the CLK_AD signal to the REF_PCK signal; (2) once aligned, align all other clocks to the REF_PCK signal. In this way, the present invention can be immune to clock tree insertion delay (at least to the first order), and does not require clock balancing between the memory controller, DFI block, and the address and data macros. Thereby integration can be made simple and easier.

Figure 4A:
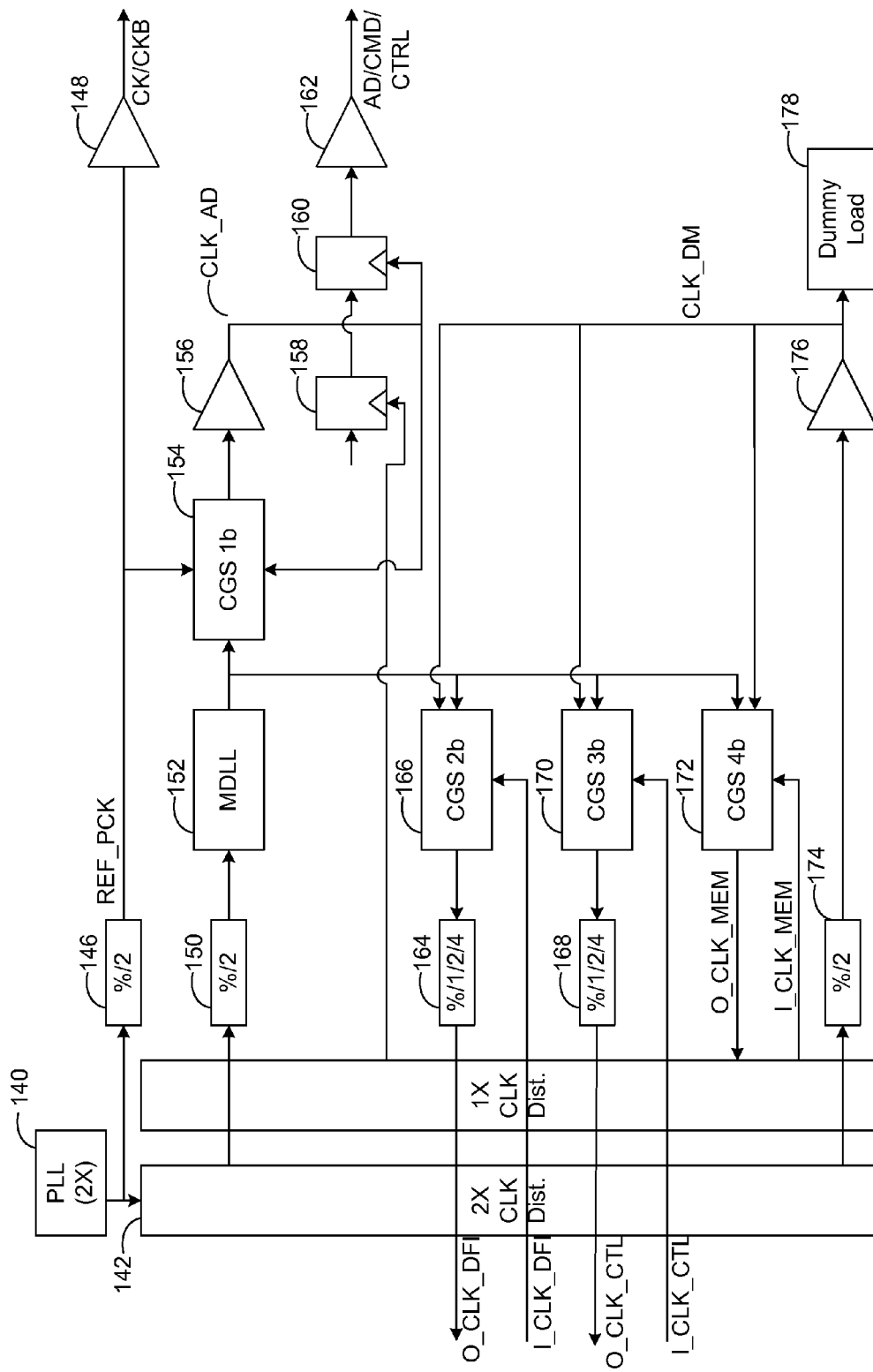
FIGS. 4a-4b illustrate a diagram of another embodiment of the present invention for synchronizing clock signals of a physical layer interface.
Figure 4B:
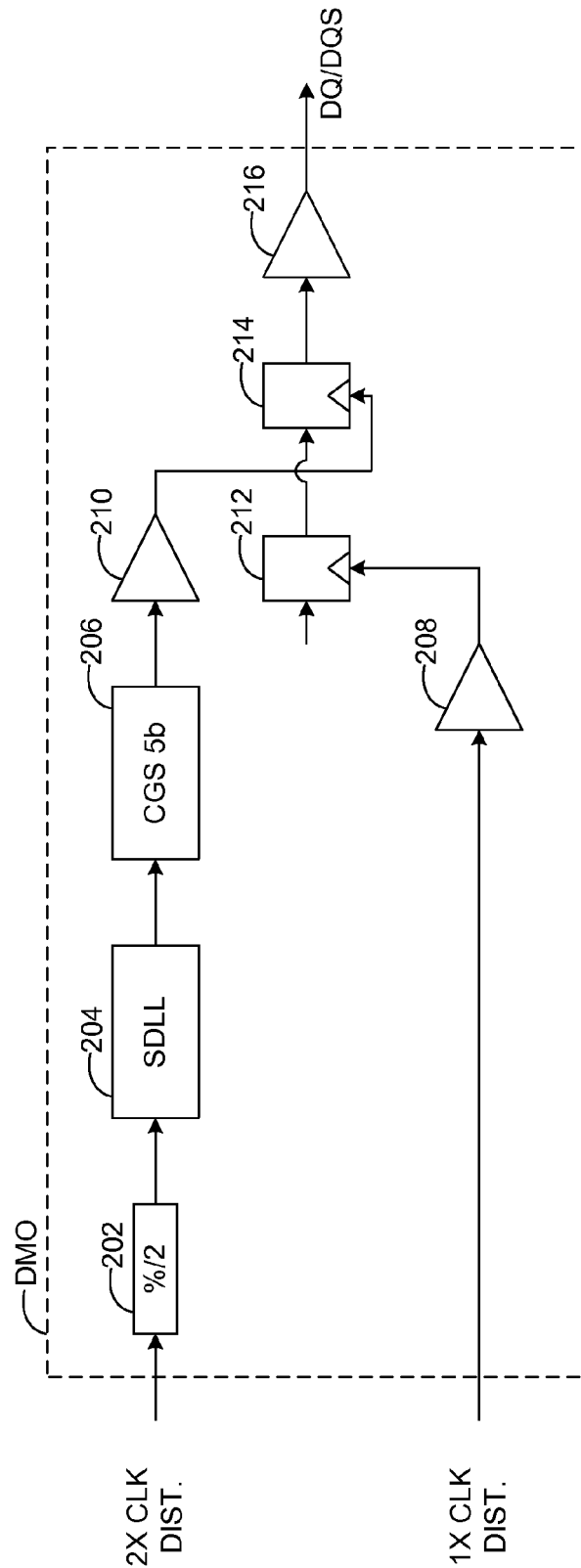

FIGS. 4a-4b illustrate a diagram of another embodiment of the present invention for synchronizing clock signals of a physical layer and a memory controller of a computing device. A clock delay computation can be eliminated, including having to distribute a configuration code across the data macros 0-8. Here, clock synchronization can be accomplished by using two clocks for synchronization. For instance, the CLK_AD signal can be synchronized to the REF_PCK signal and the rests of the clocks can be synchronized to the CLK_DM signal.

A PLL 140 generates a clock signal that has twice the frequency of a system clock signal (also referred to as the 2×-clock). The 2×-clock is distributed 142 with minimum skew between end points. The 2×-clock of the PLL 140 is divided and sent to DRAM to reduce clock jitter. The clock going to the output buffer, i.e., REF_PCK signal, can be a primary reference clock for synchronization of other clocks. The REF_PCK signal can also be outputted to a memory device, e.g., a DRAM, via a driver 148.

The 2x-clock has its frequency halved by a divider block 150 to generate a 1x-clock, which is then inputted to a MDLL 152. The MDLL 152 outputs various phase signals of the 1x-clock, which are fed to a clock generation and synchronization block 154 ("CGS 1b"), a clock generation and synchronization block 166 ("CGS 2b"), a clock generation and synchronization block 170 ("CGS 3b"), and a clock generation and synchronization block 172 ("CGS 4b").

The output clock signal from CGS 1b is distributed across the address macro via a distribution network 156. The end point of the clock distribution CLK_AD is fed back to CGS 1b. The CGS 1b compares the CLK_AD signal with the REF_PCK signal. The CGS 1b adjusts the output signal to the distribution network 156 until the CLK_AD signal is aligned to the REF_PCK signal. The output signal from CGS 1b is outputted to the distribution network 156, which further outputs to the address clock distribution. The distribution network 156 outputs to a flop 160 and feeds back the signal to the CGS 1b. Data, from the memory controller of the computing device can flow serially starting at the flop 158, to the flop 160, and to a driver 162. The driver 162 outputs the data for address, command, and control data to the memory device, e.g., DRAM.

The 2x-clock distribution can also be distributed to a divider block 174 for dividing the frequency by half, which is then outputted to the distribution network 176. A clock signal CLK_DM at the end point of the distribution network 176 is outputted to a dummy load 178. The CLK_DM can also act as a reference clock to the rest of the CGS 2b-4b to generate the PHY clock signals O_CLK_DFI and O_CLK_CTL.

Specifically, for the O_CLK_CTL signal, the generated output from the CGS 3b is inputted to a divider block 168 that can divide the frequency of the output from the CGS 3b by an integer value, e.g., by 1, by 2, by 4, or some other integer value. The controller clock signal O_CLK_CTL is fed to the memory controller, and further distributed across the memory controller. The clock signal at the end point of the memory controller clock distribution, i.e., the I_CLK_CTL signal, can be fed back to the CGS 3b in a feedback loop. The I_CLK_CTL signal is compared with the CLK_DM signal. The CGS 3b adjusts the phase of the output clock O_CLK_CTL until the incoming I_CLK_CTL is synchronized with the signal CLK_DM.

Similarly, for the O_CLK_DFI signal, the generated output from the CGS 2b is inputted to a divider block 164 that can divide the frequency of the generated output from the CGS 2b by an integer value, e.g., by 1, by 2, by 4, or some other integer value. The clock signal O_CLK_DFI is fed to the DFI block of the PHY. The clock signal at the end point of the DFI block clock distribution can be fed back as the I_CLK_DFI signal. The I_CLK_DFI signal is then compared with the CLK_DM signal. The CGS 2b adjusts the phase of the output signal O_CLK_DFI until the incoming I_CLK_DFI signal is synchronized to the CLK_DM signal.

Since the data and addresses come from the memory controller or DFI block, the data clock should be aligned to the address clock. The CGS 4b provides synchronization of a 1x-clock and the address clock. The output clock generated by the CGS 4b is distributed as the 1x-clock. The 1x-clock is inputted to a flop 158. The end of the data macro dummy load, a CLK_DM signal, is compared with the 1x-clock. The 1x-clock is adjusted until the 1x-clock is in sync with the CLK_DM signal.

FIG. 4b illustrates a data macro DM0. The other data macros DM1-8 are similar to DM0 and are not shown, but would be apparent to a person having ordinary skill in the art based on the present invention.

The active data macros DM0-8 receive a balanced 2x-clock and a balanced 1x-clock for generating clocking signals for flops 211 and 214. For instance in DM0, the 2x-clock is distributed to a divider block 202. The divider block divides the frequency of the 2x-clock by 2 to generate a 1x-clock. The 1x-clock is outputted to the SDLL 204. The SDLL 204 outputs a signal to a CGS 5b. The CGS 5b generates a signal based on the input from the SDLL 204. The generated signal of the CGS 5b is outputted to a distribution network 210 for clocking a flop 214. The 1x-clock from CGS 4b is outputted to a distribution network 208 for clocking a flop 212. Data, from the memory controller of the computing device can flow serially starting at the flop 212, to the flop 214, and to a driver 216. The driver 216 outputs the signal DQ/DQS to the memory device, e.g., DRAM. Similarly, for the other DM1-8, the 2x-clock and 1x-clock are distributed in a similar manner for those data macros.

Figure 5:
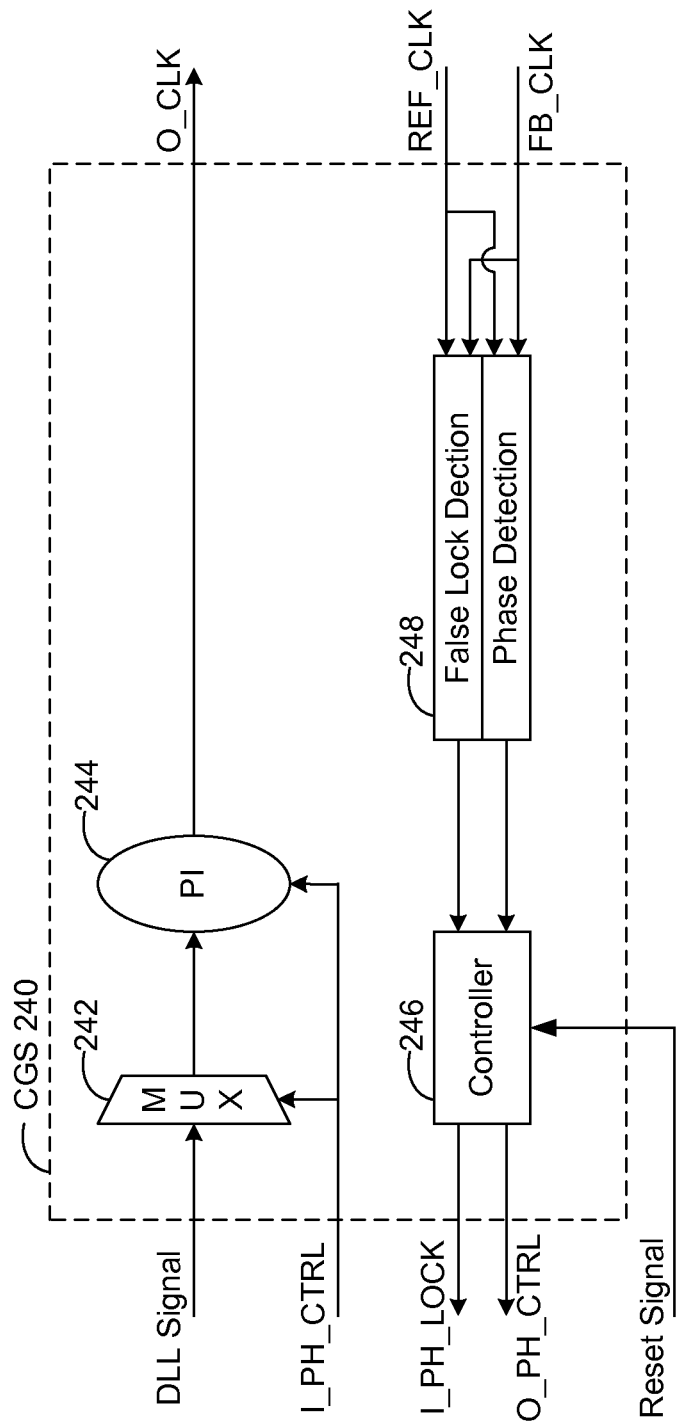
FIG. 5 illustrates a diagram of a clock generation and synchronization block of the present invention.

FIG. 5 illustrates a diagram of a clock generation and synchronization block of the present invention. A clock generation and synchronization block 240 can comprise a phase selection multiplexer 242, a phase interpolator ("PI") 244, a controller 246, and a clock alignment block 248. The clock alignment block can provide phase detection and false lock detection for inputted signals, REF_CLK and FB_CLK.

The phase selection multiplexer 242 selects two adjacent phases from a DLL's (e.g., MDLL's or SDLL's) phase outputs according to a control signal I_PH_CTRL. The control signal I_PH_CTRL can also control the PI 244. Generally, the DLL outputs 8 phases to the multiplexer 242. The selected two adjacent phases are interpolated by the PI 244 to generate a delayed clock O_CLK. The incoming clocks REF_CLK and FB_CLK are inputted to the clock alignment block 248, which generates up/down signals to the controller 246 based upon whether the signals are phase aligned, and if that alignment is a false lock. For instance, the false lock detection compares the REF_CLK and FB_CLK, and generates a false signal when the REF_CLK and FB_CLK are out of phase. The controller 246 reads the up/down signal from the clock alignment block 248, and generates I_PH_LOCK. Also, the O_PH_CTRL signal can be incremented or decremented based on whether the REF_CLK signal is leading or lagging the FB_CLK signal, and vice versa.

Figure 6:
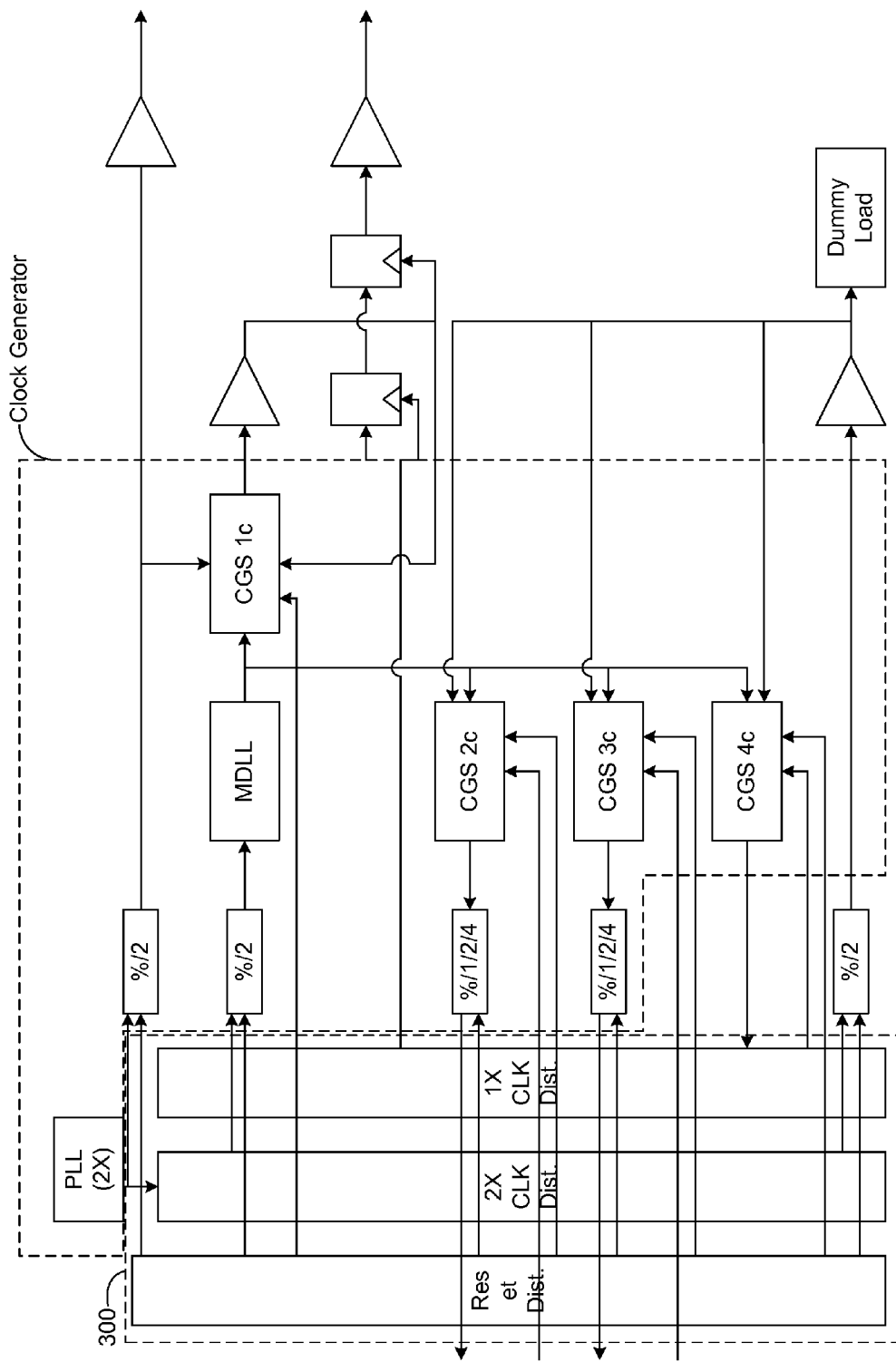
FIG. 6 illustrates a diagram for distributing reset and clock signals across an address macro of the physical layer of the present invention.
Figure 7:
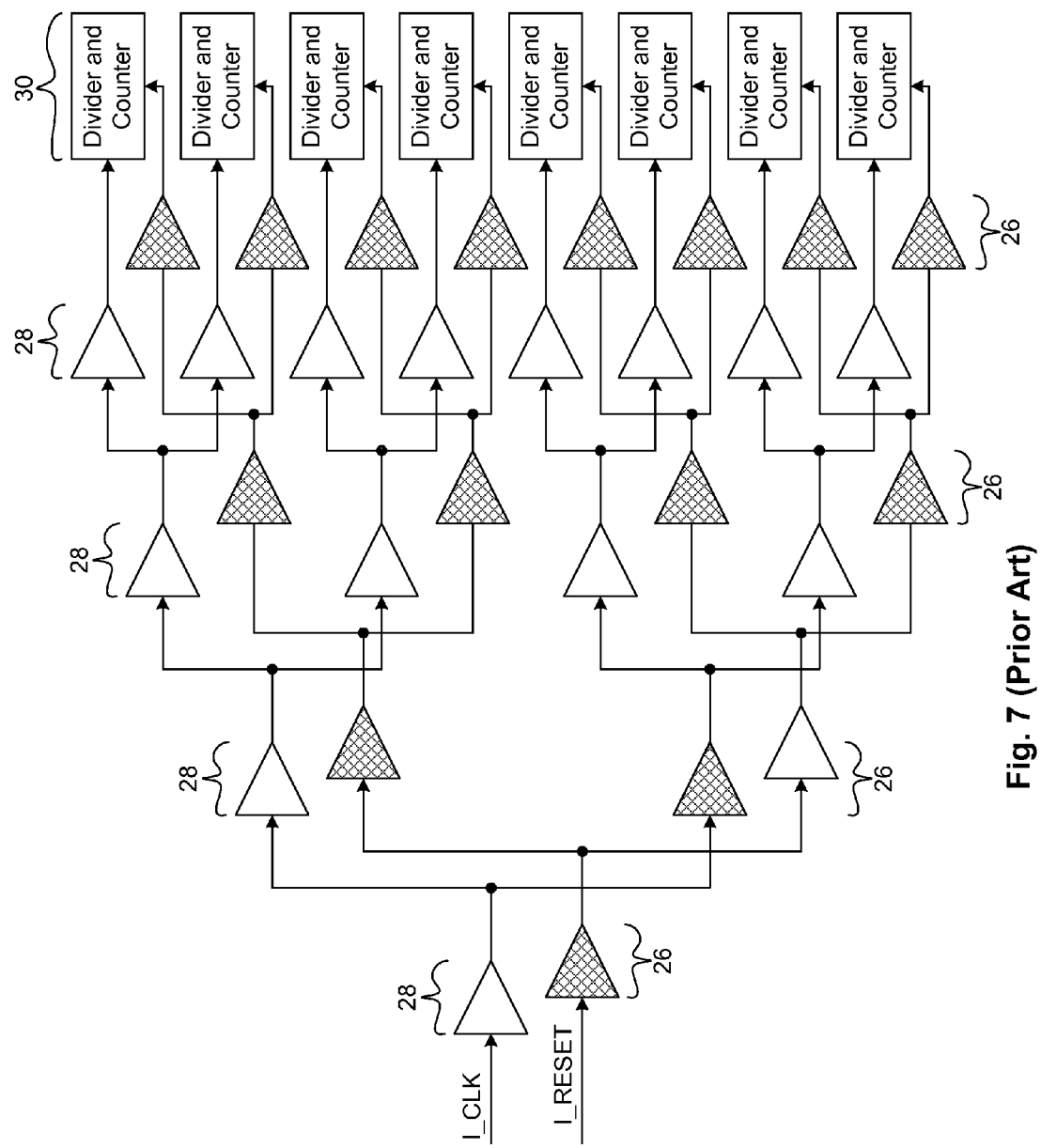
FIG. 7 illustrates a diagram of a distribution network of the prior art for distributing clock and reset signals.

FIG. 6 illustrates a diagram for distribution of a reset signal and clock signals across an address macro of the physical layer of the present invention. A distribution network of the present invention can distribute a reset signal and clock signals to the PHY, and, in particular, to the clock generator and the address and data macros. For instance, a reset distribution and clock signal distributions 300 are distributed to the clock generator and the address macro. In particular, the reset and clock distributions are inputted to the dividers, CGS's, and the flops of the clock generator and the address macro.

Figure 8:
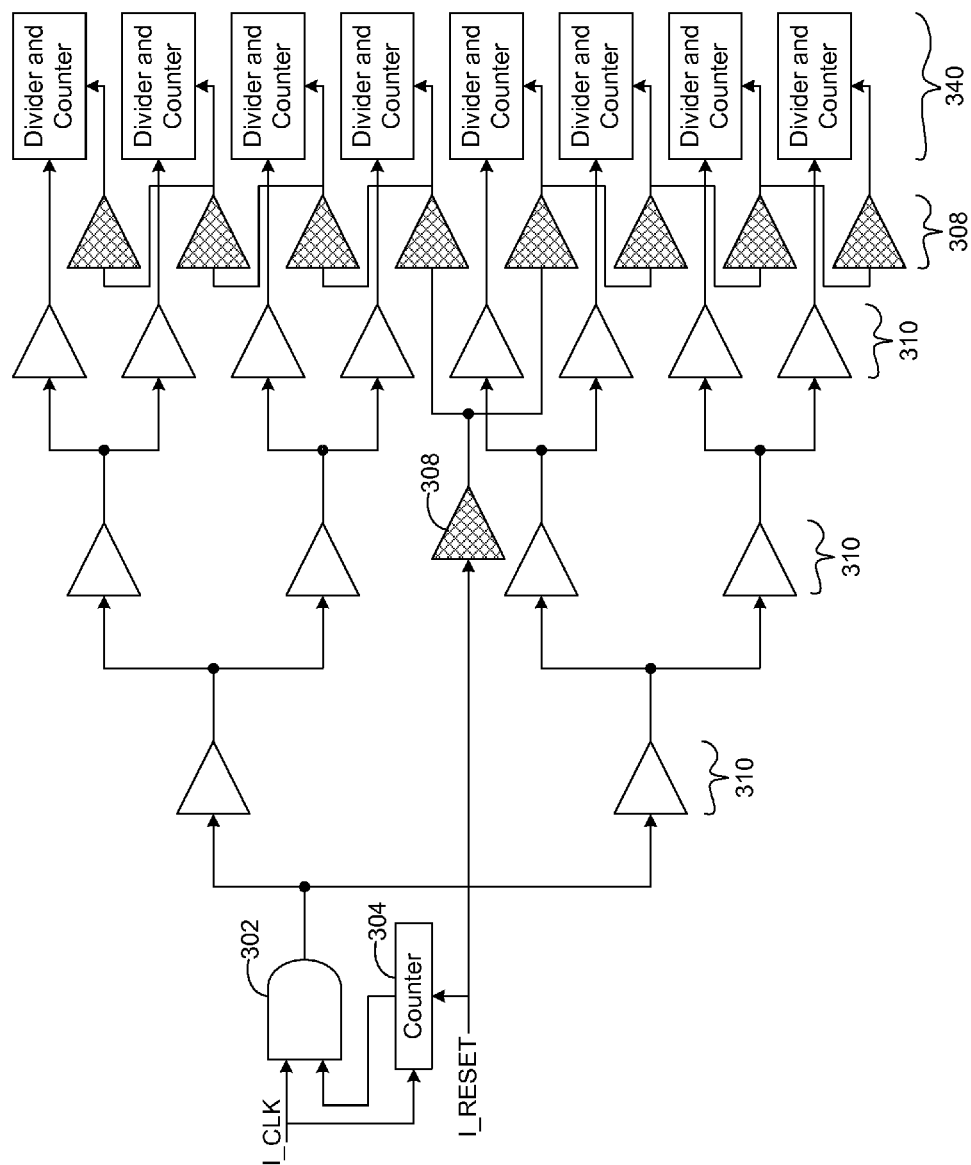
FIG. 8 illustrates a diagram of the present invention for distributing clock and reset signals.

FIG. 8 illustrates a diagram of the present invention for a distribution network for clock and reset signals. In the address and data macros of the PHY, there are various divider and counter blocks that need to be synchronized to prevent scrambling data. The counters are aligned to the data, such that data set A is sent first and then data set B is sent next. The counter can be used to keep track of the order of each data set.

The DDR PHY can employ divider and counter blocks 340 for proper data transfer. The divider and counter blocks 340 are spread over an area, e.g., an area of 10 mm^2. Any mismatch between the divider and counter blocks 340 can either affect latency or can cause functional failure. Thus, careful distribution of the reset signals must be carefully distributed in conjunction with a clock signal I_CLK.

The distribution network comprises a NAND gate 302, a counter 304, drivers 308 for transmitting the I_RESET signal, drivers 310 for transmitting the I_CLK signal, and the divider and counter blocks 340. The drivers 308 and 310 can be clock drivers, buffers, amplifiers, or other circuit elements for retransmitting a signal.

The drivers 308 can be connected to each other in an unbalanced distribution tree, e.g., the drivers can be connected together in a daisy chain to form an unbalanced distribution tree. The end points of the unbalanced distribution tree are connected to the divider and counter blocks 340 to provide these circuit elements the reset signal I_RESET. Since the drivers 308 are connected in an unbalanced distribution tree, the reset signals at the end points of the unbalanced distribution tree are asynchronously received by the divider and counter blocks 340 via the drivers 308.

The drivers 310 can be connected to each other in a balanced distribution tree, e.g., a binary distribution tree. The end points of the balanced distribution tree are connected to the divider and counter blocks 340. Since the drivers 310 are connected in a balanced distribution tree, the clock signals at the end points of the balanced distribution tree are synchronously received by the divider and counter blocks 340 via the drivers 310.

Upon receiving a high signal for the I_RESET signal to signify a reset, the clock signal I_CLK can be gated off by the NAND gate 302 from being distributed to the balanced distribution tree of the drivers 310. The counter 304 can count an M number of clock cycles before gating off the signal.

Upon receiving a low signal for the I_RESET signal to signify an end to the reset, the clock signal I_CLK can be gated back on by the NAND gate 302 after an N number of clock cycles from the point after receiving the end of the reset. The purpose of waiting the N number is to be sure that the reset signal has propagated to all of the divider and counter blocks 340 via the unbalanced distribution tree of the drivers 308. Thereby, the reset signal I_RESET can be distributed as a normal asynchronous signal. The active edge of the reset signal I_RESET is provided to the divider and counter blocks 310 to reset/initialize them.

It is understood by a person having ordinary skill in the art that the distribution network of the present invention can be used for distributing clock and reset signals to other circuit blocks that require synchronous clock signals without much skewing. For illustration, the present invention uses a divider and counter blocks as examples of such circuit blocks. However, it's understood that other circuit blocks can be used as well with the present invention.

Figure 9:
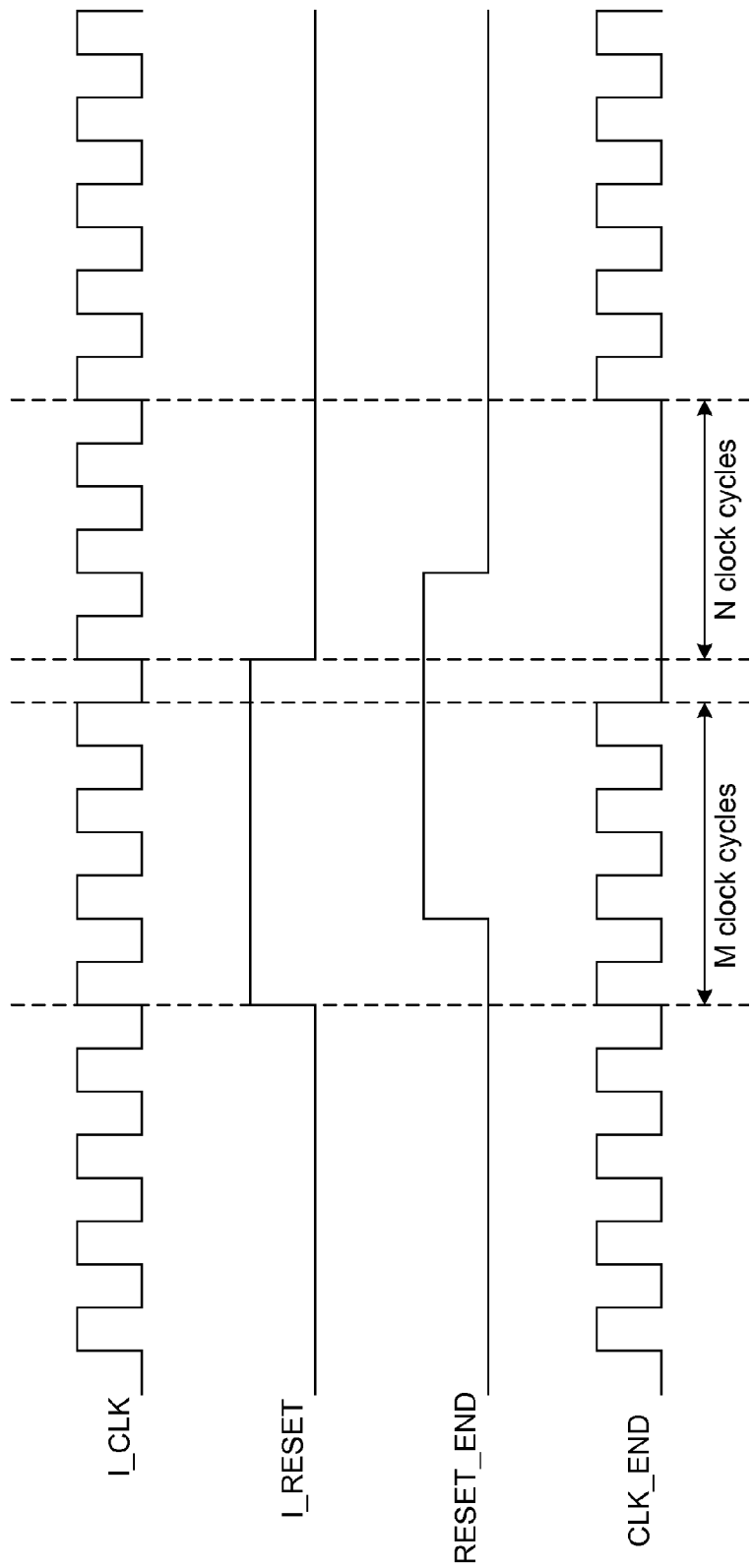
FIG. 9 illustrates a graph of clock signals for a distribution network of the present invention.

FIG. 9 illustrates a graph for clock signals for a distribution network of the present invention for distributing clock and reset signals. Since the clock distribution and reset signals are performed according to the present invention, the divider and counter blocks 340 can begin counting at the same, e.g., after N number of clock cycles from the end of the I_RESET signal.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

We claim:

1. A distribution network for distributing clock and reset signals across an address macro, comprising:
   circuit blocks having dividers and counters, wherein the dividers and counters are synchronized relative to a clock signal;
   drivers connected in a balanced tree for distributing the clock signal synchronously to the circuit blocks, wherein the clock signal is gated before being inputted to the drivers connected in the balanced tree;
   drivers connected in an unbalanced tree for distributing a reset signal asynchronously to the circuit blocks;
   a logic gate for gating the clock signal to the drivers connected in the balanced tree; and
   a first counter,
   wherein the clock signal is inputted to the logic gate,
   wherein an output of the logic gate is connected to the balanced tree,
   wherein the logic gate enables the distribution of the clock signal to the balanced tree as a function of the reset signal,
   wherein the clock signal and the reset signal are inputted to the first counter,
   wherein the output of the first counter is inputted to the logic gate,
   wherein the clock signal is distributed via the balanced tree as a function of the reset signal,
   wherein, when the reset signal is activated, the clock signal is gated off from being inputted to the drivers connected in the balanced tree and the reset signal is asynchronously distributed to the circuit blocks via the drivers connected in the unbalanced tree, and
   wherein, when the reset signal is disabled, the clock signal is gated on after a first predefined number of clock cycles.

2. The distribution network of claim 1 wherein when the reset signal is activated, the first counter counts a second predefined number of clock cycles before the logic gate is gated off to block the clock signal from being distributed via the balanced tree.

3. The distribution network of claim 2 wherein when the reset signal is deactivated, the first counter counts the first predefined number of clock cycles before the logic gate is gated on to allow the clock signal to be distributed via the balanced tree.

4. The distribution network of claim 1 wherein the balanced tree is a binary tree.

5. The distribution network of claim 1 wherein the unbalanced tree is connected in a daisy-chain, wherein the reset signal is inputted to a certain one of the daisy-chained drivers of the unbalanced tree, and wherein the reset signal is further distributed by other ones of the daisy-chained drivers of the unbalanced tree.

6. A clock signal distribution network for distributing clock and reset signals across an address macro, comprising:
   circuit blocks having dividers and counters, wherein the dividers and counters are synchronized relative to a clock signal;
   drivers connected in a balanced tree for distributing the clock signal synchronously to the circuit blocks, wherein the clock signal is gated before being inputted to the drivers connected in the balanced tree;
   drivers connected in an unbalanced tree for distributing a reset signal asynchronously to the circuit blocks;
   a first counter; and
   an AND gate for gating the clock signal to the drivers connected in the balanced tree, wherein the clock signal and the reset signal are inputted to the first counter, wherein the output of the first counter is inputted to the AND gate, wherein the clock signal is distributed via the balanced tree as a function of the reset signal, wherein the clock signal is inputted to the AND gate, wherein an output of the AND gate is connected to the balanced tree, wherein the AND gate enables the distribution of the clock signal to the balanced tree as a function of the reset signal, wherein, when the reset signal is activated, the clock signal is gated off from being inputted to the drivers connected in the balanced tree and the reset signal is asynchronously distributed to the circuit blocks via the drivers connected in the unbalanced tree, and wherein, when the reset signal is disabled, the clock signal is gated on after a first predefined number of clock cycles.

7. The distribution network of claim 6 wherein when the reset signal is activated, the first counter counts a second predefined number of clock cycles before the AND gate is gated off to block the clock signal from being distributed via the balanced tree.

8. The distribution network of claim 7 wherein when the reset signal is deactivated, the first counter counts the first predefined number of clock cycles before the AND gate is gated on to allow the clock signal to be distributed via the balanced tree.

9. The distribution network of claim 6 wherein the balanced tree is a binary tree.

10. The distribution network of claim 6 wherein the unbalanced tree is connected in a daisy-chain, wherein the reset signal is inputted to a certain one of the daisy-chained drivers of the unbalanced tree, and wherein the reset signal is further distributed by other ones of the daisy-chained drivers of the unbalanced tree.

11. A clock signal distribution network, comprising:

circuit blocks having counters, wherein the counters are synchronized relative to a clock signal;

drivers connected in a balanced tree for distributing the clock signal synchronously to the circuit blocks, wherein the balanced tree is a binary tree;

drivers connected in an unbalanced tree for distributing a reset signal to the circuit blocks, wherein the unbalanced tree is connected in a daisy-chain;

a first counter; and an AND gate, wherein the clock signal and the reset signal are inputted to the first counter, wherein the output of the first counter is inputted to the AND gate, wherein the clock signal is distributed via the balanced tree as a function of the reset signal, wherein the clock signal is inputted to the AND gate, wherein an output of the AND gate is connected to the balanced tree, wherein the AND gate enables the distribution of the clock signal to the balanced tree as a function of the reset signal, wherein, when the reset signal is activated, the clock signal is gated off from being inputted to the drivers connected in the balanced tree and the reset signal is asynchronously distributed to the circuit blocks via the drivers connected in the unbalanced tree, and wherein, when the reset signal is disabled, the clock signal is gated on after a first predefined number of clock cycles.

12. The distribution network of claim 11 wherein when the reset signal is activated, the first counter counts a second predefined number of clock cycles before the AND gate is gated off to block the clock signal from being distributed via the balanced tree.

13. The distribution network of claim 12 wherein when the reset signal is deactivated, the first counter counts the first predefined number of clock cycles before the AND gate is gated on to allow the clock signal to be distributed via the balanced tree.

14. The distribution network of claim 11 wherein the reset signal is inputted to a certain one of the daisy-chained drivers of the unbalanced tree, and wherein the reset signal is further distributed by other ones of the daisy-chained drivers of the unbalanced tree.

\* \* \* \* \*